(12) United States Patent
Kuwayama

(10) Patent No.: US 8,278,569 B2
(45) Date of Patent: Oct. 2, 2012

(54) MISSING PART CHECKING STRUCTURE

(75) Inventor: Takashi Kuwayama, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 176 days.

(21) Appl. No.: 12/736,010

(22) PCT Filed: Mar. 2, 2009

(86) PCT No.: PCT/JP2009/054350
§ 371 (c)(1),
(2), (4) Date: Sep. 1, 2010

(87) PCT Pub. No.: WO2009/110621
PCT Pub. Date: Sep. 11, 2009

(65) Prior Publication Data
US 2010/0319984 A1  Dec. 23, 2010

(30) Foreign Application Priority Data

Mar. 5, 2008 (JP) .................................. 2008-055547
Nov. 25, 2008 (JP) .................................. 2008-299674

(51) Int. Cl.
*H01R 13/502* (2006.01)
(52) U.S. Cl. .................. 174/562; 174/559; 361/759
(58) Field of Classification Search .................. 174/562, 174/559, 520; 361/747, 759
See application file for complete search history.

(56) References Cited

U.S. PATENT DOCUMENTS

| | | | | |
|---|---|---|---|---|
| 4,158,757 A | * | 6/1979 | Reichert et al. | 200/302.1 |
| 4,225,748 A | * | 9/1980 | Buck et al. | 174/541 |
| 4,528,616 A | * | 7/1985 | Koppensteiner | 361/752 |
| 4,963,752 A | * | 10/1990 | Landis et al. | 250/459.1 |
| 5,230,759 A | * | 7/1993 | Hiraiwa | 156/69 |
| 5,272,580 A | * | 12/1993 | Hickox et al. | 360/99.18 |
| 5,317,462 A | * | 5/1994 | Kakizaki et al. | 360/99.16 |
| 5,413,489 A | * | 5/1995 | Switky | 439/71 |
| 6,272,018 B1 | * | 8/2001 | Feld et al. | 361/760 |
| 6,570,089 B1 | * | 5/2003 | Mc Grew et al. | 174/50 |
| 7,248,355 B2 | * | 7/2007 | Larson | 356/239.1 |
| 7,280,370 B2 | * | 10/2007 | Chan | 361/767 |
| 2006/0054338 A1 | * | 3/2006 | Larson | 174/520 |

FOREIGN PATENT DOCUMENTS

| | | |
|---|---|---|
| JP | 2001-56011 | 2/2001 |
| JP | 2001-246907 | 9/2001 |
| JP | 2001-252449 | 9/2001 |

(Continued)

OTHER PUBLICATIONS

Extended European Search Report dated May 19, 2012.

*Primary Examiner* — Hung Ngo
(74) *Attorney, Agent, or Firm* — Harness, Dickey & Pierce, P.L.C.

(57) ABSTRACT

A structure is provided for checking a missing part in an electric device with an accommodation space for an electric component (6) and an exterior cover (11) to close the space. The structure includes cover male screws (12a, 12b) and base members (4A, 4B) which are detachably fixed in the accommodation space, on which the electric component (6) is inseparably fixed, and which include cover female screws (8a, 8b, 9a, 9b) receiving the cover male screws (12a, 12b) to detachably fix the exterior cover (11). When one of the base members (4A, 4B) with the electric component (6) is removed from the accommodation space, the exterior cover (11) is unfixable to the electric device.

5 Claims, 10 Drawing Sheets

B-B CROSS SECTION

FOREIGN PATENT DOCUMENTS

| | | |
|---|---|---|
| JP | 2001249598 A | 9/2001 |
| JP | 20029459 A | 1/2002 |
| JP | 2002059149 A | 2/2002 |
| JP | 2002315940 A | 10/2002 |
| JP | 2004069811 A | 3/2004 |
| JP | 4405166 B | 10/2004 |
| JP | 2004347899 A | 12/2004 |
| JP | 2005301221 A | 10/2005 |
| JP | 2005301863 A | 10/2005 |
| JP | 2006211484 A | 8/2006 |
| JP | 2006337774 A | 12/2006 |

* cited by examiner

C-C CROSS SECTION

A-A CROSS SECTION

B-B CROSS SECTION

C-C CROSS SECTION

A-A CROSS SECTION

B-B CROSS SECTION

C-C CROSS SECTION

A-A CROSS SECTION

B-B CROSS SECTION

MISSING PART CHECKING STRUCTURE

TECHNICAL ART

The present invention relates to a structure to checking a missing part, more particularly to a structure to externally checking whether or not a collected machine is usable for a recycled product.

TECHNOLOGICAL BACKGROUND

Electronic machinery manuracturers have been promoting recycling by collecting their used products to recover reusable ones. There are two ways to collect used products; one is that users directly send used products to a collection facility and the other is that users send them to business offices of local distributors which temporarily store the used products and send various kinds of used products to a collection facility together. Then, the collection facility determines reusability of collected products and delivers non-reusable products to a recycling facility to destroy them while delivering reusable products to a reproduction facility. These collected products, however, may include defective products lacking some components which have been removed by users before disposal for their own purposes. This may cause a problem that the reproduction facility needs to spend a lot of time and resource to find reproducible products from the collected products.

Meanwhile, in order for manuracturers to continuously promote the environmental conservation, cost efficiency is an important factor. In view of achieving satisfiable cost performance, there is a need for a device or a method which can cost-efficiently check missing components in collected products. For example, Japanese Unexamined Patent Application Publication No. 2004-69811 (Reference 1) discloses a device which allows a collector to easily find that a collected machine is a recycled product from the exterior thereof. Japanese Unexamined Patent Application Publication No. 2004-347899 (Reference 2) discloses an electronic substrate mounting structure of an electrophotographic imaging device which achieves a reduced number of screws by concurrently releasing fastening of an occasionally detached component such as an exterior cover and an electric wave shield cover. Japanese Unexamined Patent Application Publication No. 2006-211484 (Reference 3) discloses system and method of checking a missing component and an assembly error by an inspection program which is boosted according to a manipulation to a keycap in a production process for assembling in the same production line a complex machine which comprises a plurality of functions of copying, facsimile, printing and the like, a controller executing the functions, a panel with keycaps to be manipulated by users for execution of the respective functions.

However, the device in Reference 1 is intended for determining whether a collected machine is a reproduced machine and determining an outer condition of the machine but not for determining if there is a missing part inside the machine. Also, the substrate mounting structure in Reference 2 has features in the reduced number of screws but it cannot check if there is a missing part inside a collected machine. Further, the system in Reference 3 can check a missing component and an assembly error by boosting an inspection program according to a manipulation to a keycap but has a problem in terms of cost efficiency and checkup sustainability since buildup of the system requires a great amount of money and a checkup of a missing part is not feasible without turning on the machine. Moreover, turning on the machine without knowing its internal condition may cause a problem such as short-circuit.

DISCLOSURE OF THE INVENTION

An object of the present invention is to provide an electric device (for example, an image generation device) which comprises a cost-effective mechanism to check a missing component without being powered on, in order for manuracturers to provide reproduced products to make continuous contribution to the environmental conservation.

According to one aspect of the present invention, a missing part checking structure is mounted in an electric device having an accommodation space for a main component and an exterior cover to close the accommodation space, to allow presence or absence of the main component to be checked from exterior of the electric device. The structure is configured to include a fastening member; a base member which is detachably fixed in the accommodation space, on which the main component is inseparably fixed, and which comprises a receive portion receiving the fastening member to detachably fasten the exterior cover with the fastening member, in which when the base member together with the main component is removed from the accommodation space, the exterior cover is configured to be unfixable to the electric device.

In one features of this aspect, the fastening member is a male screw and the receive portion is a female screw into which the male screw is screwed.

In the other features of this aspect, the missing part checking structure is configured to further include a first stick member standing on the base member, in which the receive portion is provided at one end of the first stick member.

In the other features of this aspect, the missing part checking structure is configured to further include a second stick member standing on the base member, in which the exterior cover comprises a hole through which the fastening member passes to be fitted into the receive portion, and an opening from which an end portion of the second stick member protrudes.

In the other features of this aspect, the end portion of the second stick member is different in color from the exterior cover.

BEST MODE FOR CARRYING OUT THE INVENTION

Hereinafter, embodiments of the present invention will be described in detail with reference to the accompanying drawings. However, it is to be understood that components, and types, combinations, shapes thereof, and their relative positions in the following embodiments are only illustrative and exemplary of the present invention and is made merely for the purpose of providing a full and enabling disclosure of the invention.

A structure of the present invention is configured to check whether or not a main component is removed from inside of an electric device according to presence or absence of a screw to fasten an exterior cover and/or a predetermined indication, with the exterior cover attached. The following embodiments will describe an example in which two base members each with a printed circuit board 5 (main component) undetachably mounted by rivets are provided in a housing, for the sake of simplicity. The structure is configured that in order to detach the printed circuit board on purpose, the base member need be concurrently detached.

Figure 1A:
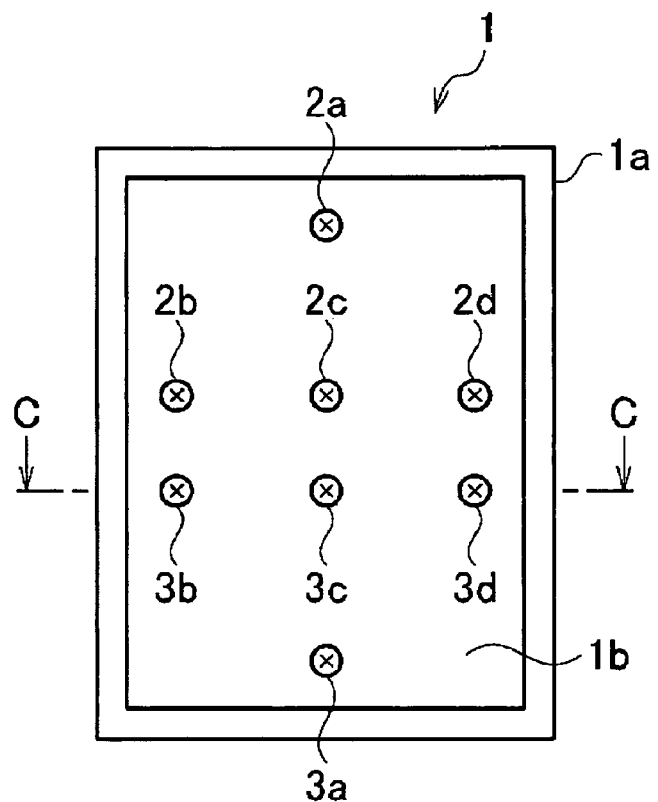
FIGS. 1A to 1C show an assembly of each component of a structure according to a first embodiment.
Figure 1A:
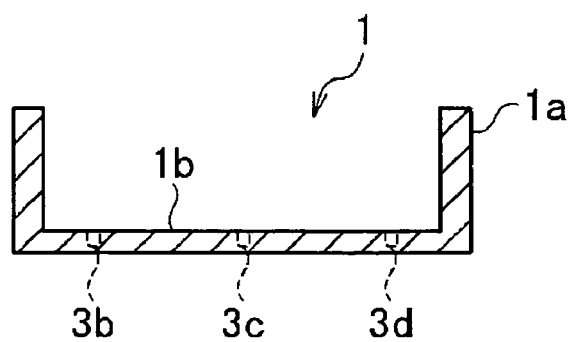
Figure 1B:
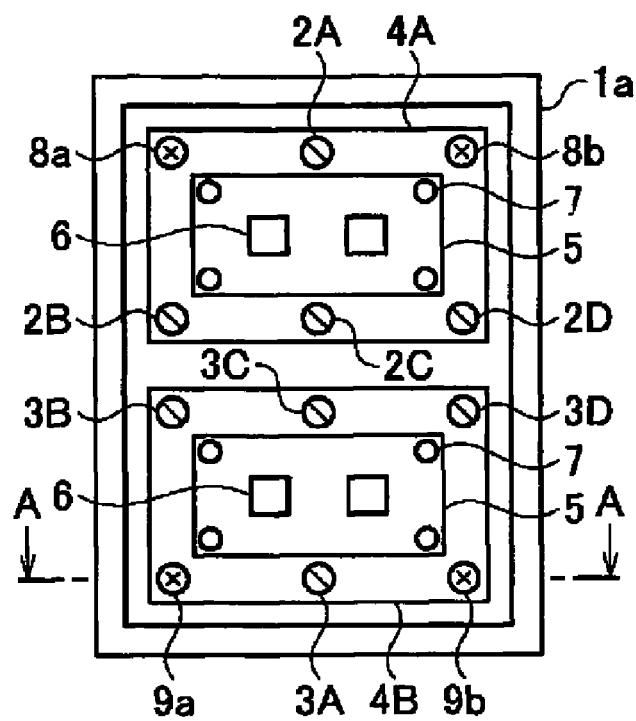
Figure 1B:
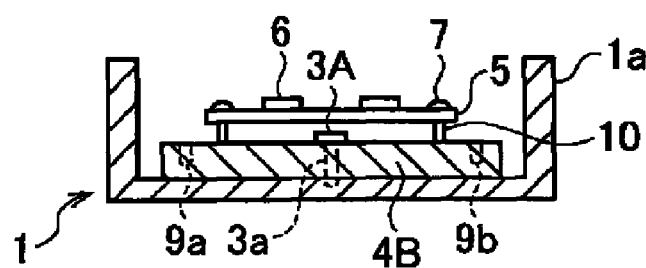
Figure 1C:
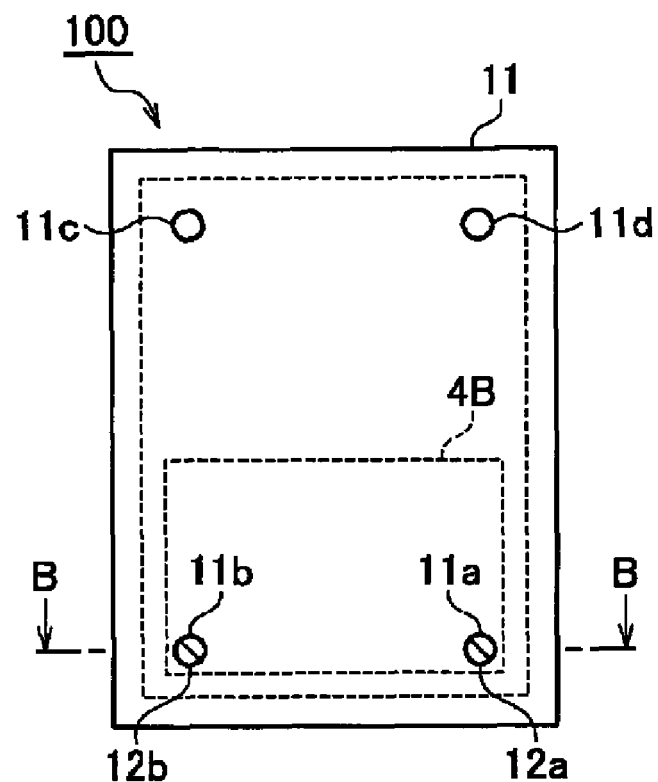
Figure 1C:
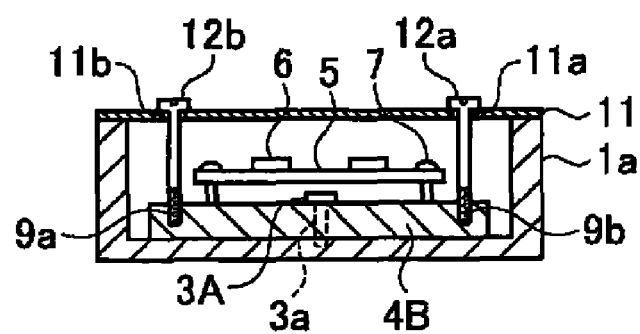

FIGS. 1A to 1C show an assembly of each component of a structure 100 according to a first embodiment. A top view of FIG. 1A is a plain view of a housing and a bottom view thereof is a cross section of the housing along a C-C line. A top view of FIG. 1B is a plain view of the housing to which a base member is attached and a bottom view thereof is a cross section of the housing along an A-A line. A top view of FIG. 1C is a plain view of the housing to which an exterior cover is attached after the base member is detached and a bottom view thereof is a cross section of the housing along a B-B line. The top view of FIG. 1A shows a housing 1 which is surrounded by a frame 1a and has base female screws 2a to 2d, 3a to 3d in a bottom portion 1b to fix base members 4A, 4B (top view of FIG. 1B). The housing 1 is made of a metal member such as aluminum or an iron plate, therefore, it is easy to form the base female screws in the bottom portion 1b by tapping.

Next, the top view of FIG. 1B shows the base members 4A and 4B to which a printed circuit board 5 is fixed with rivets 7. An electronic component 6 is mounted on the printed circuit board 5 in advance. In order to attach the base member 4A to the housing 1, cover female screws (receive portion) 8a, 8b are disposed in alignment with through holes 11c, 11d of the exterior cover 11. Then, to fasten the base member 4A, a base male screw 2A is screwed into the base female screw 2a, a base male screw 2B is screwed into the base female screw 2b, a base male screw 2C is screwed into the base female screw 2c, and a base male screw 2D is screwed into the base female screw 2d. Similarly, in order to attach the base member 4B to the housing 1, cover female screws 9a, 9b are disposed in alignment with through holes 11b, 11a of the exterior cover 11. Then, to fasten the base member 4B, a base male screw 3A is screwed into the base female screw 3a, a base male screw 3B is screwed into the base female screw 3b, a base male screw 3C is screwed into the base female screw 3c, and a base male screw 3D is screwed into the base female screw 3d. Now, the base members 4A, 4B are fixed to the housing 1 with the four base male screws and the cover female screws 8a, 8b, 9a, 9b are positioned in the four corners of inside the frame 1a. The printed circuit boards 5 are mounted over the base member 4A, 4B via spacers 10. The first embodiment uses the rivets 7 to fix the printed circuit boards 5. However, the printed circuit boards 5 can be fixed by an adhesive or in other manners.

Then, as shown in the top view of FIG. 1C, the exterior cover 11 is placed on the housing 1 to cover it. The exterior cover 11 is configured to include the through holes 11a to 11d through which four cover male screws (fastening member) 12 are inserted. The cover female screws 8a, 8b, 9a, 9b are disposed in alignment with the through holes 11a to 11d so that the cover male screws 12 are screwed into the cover female screws 8a, 8b, 9a, 9b. Next, the housing 1 without the base member 4A will be described, for example. In the bottom view of FIG. 1C, a cover male screw 12a is screwed into the cover female screw 9b, and a cover male screw 12b is screwed into the cover female screw 9a. However, without the base member 4A, the cover female screws 8a, 8b for the through holes 11c, 11d of the exterior cover 11 are absent so that the two other cover male screws cannot be screwed into the cover female screw 8a, 8b. Accordingly, the two other cover male screws are missing in the through holes 11c, 11d. Thus, a removal of the base member is recognizable from exterior of the electric device.

Figure 2A:
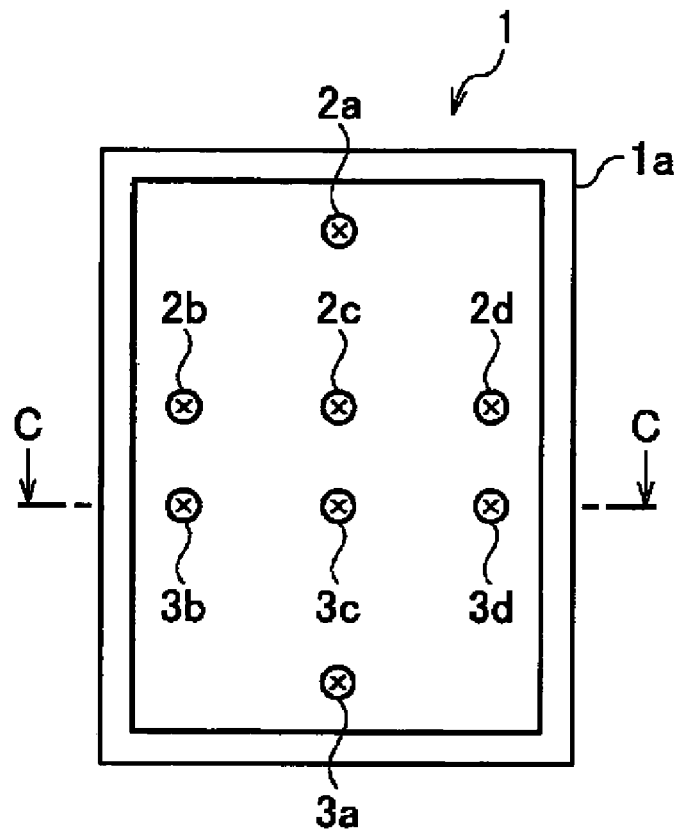
FIGS. 2A to 2C show an assembly of each component of a structure according to a second embodiment.
Figure 2A:
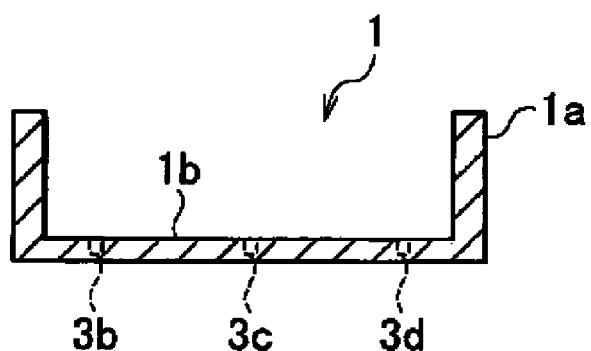
Figure 2B:
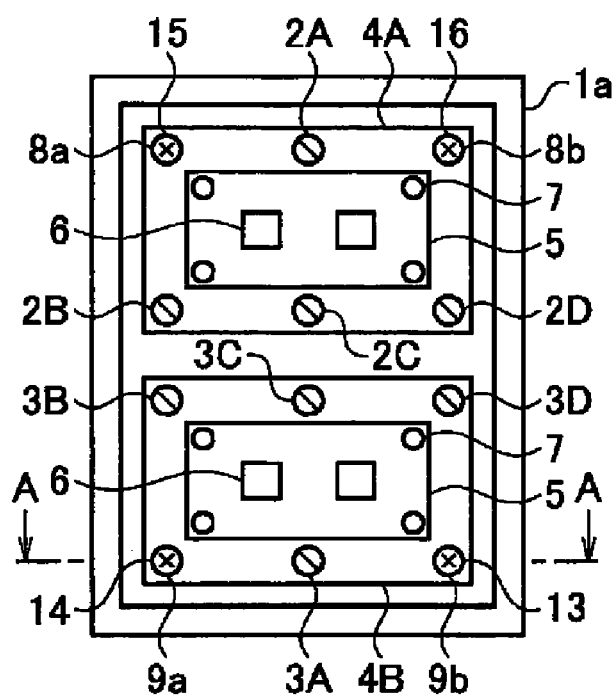
Figure 2B:
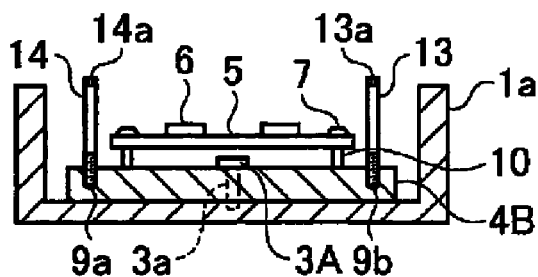
Figure 2C:
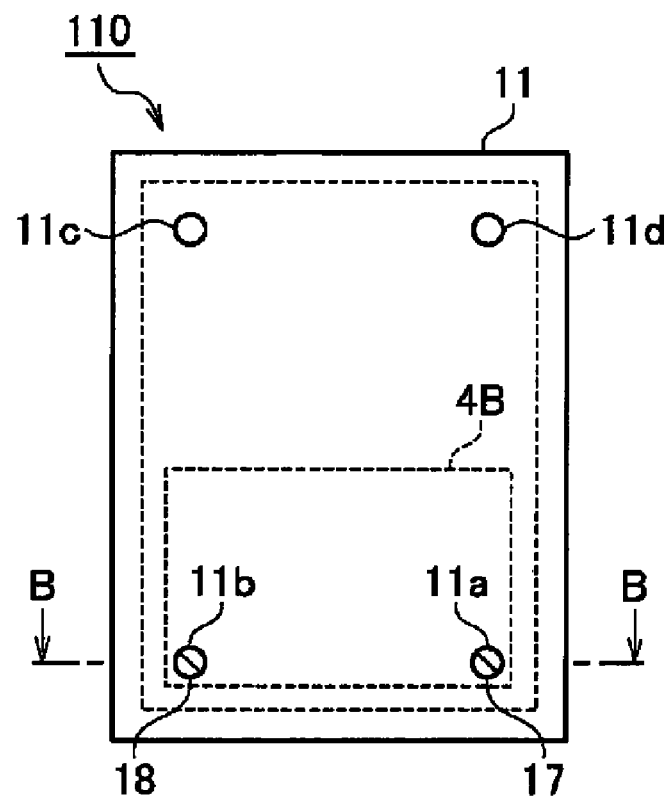
Figure 2C:
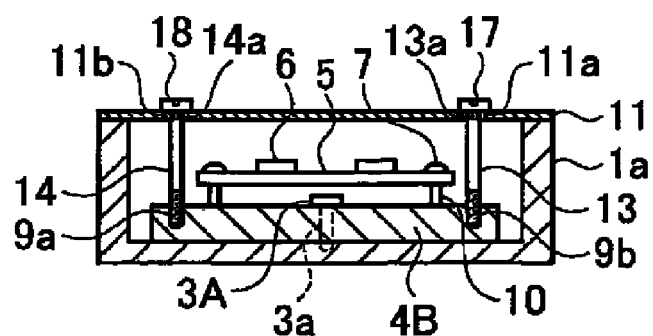

FIGS. 2A to 2C show an assembly of each component of a structure 110 according to a second embodiment. A top view of FIG. 2A is a plain view of a housing and a bottom view thereof is a cross section of the housing along a C-C line. A top view of FIG. 2B is a plain view of the housing to which a base member is attached and a bottom view thereof is a cross section of the housing along an A-A line. A top view of FIG. 2C is a plain view of the housing to which an exterior cover is attached after the base member is detached and a bottom view thereof is a cross section of the housing along a B-B line. The same components as those in FIGS. 1A to 1C will be given the same numeric codes.

The structure 110 in FIG. 2A to FIG. 2C is different from that in FIGS. 1A to 1C in including female stick screws (stick member) 13 to 16 which pass through through holes 11a to 11d to be screwed with four cover male screws. As in the top view of FIG. 2B, a printed circuit board 5 is fixed to each of base members 4A, 4B by rivets 7. An electronic component 6 is mounted on the printed circuit board 5 in advance. In order to fix the base member 4A to a housing 1, cover female screws 8a, 8b are disposed in alignment with the through holes 11c, 11d of the exterior cover 11, respectively. Then, to fasten the base member 4A, a base male screw 2A is screwed into a base female screw 2a, a base male screw 2B is screwed into a base female screw 2b, a base male screw 2C is screwed into a base female screw 2c, and a base male screw 2D is screwed into a base female screw 2d. Similarly, in order to fix the base member 4B to the housing 1, cover female screws 9a, 9b are disposed in alignment with through holes 11b, 11a of the exterior cover 11, respectively. Then, to fasten the base member 4B, a base male screw 3A is screwed into a base female screw 3a, a base male screw 3B is screwed into a base female screw 3b, a base male screw 3C is screwed into a base female screw 3c, and a base male screw 3D is screwed into a base female screw 3d. Thereby, the base members 4A, 4B are each fixed to the housing 1 with the four base male screws, and the cover female screw 8a, 8b, 9a, 9b are placed in the four corners of the frame 1a. In the second embodiment, the female stick screws (first stick member) 13 to 16 stand in the cover female screws 8a, 8b, 9a, 9b to reach the through holes 11a to 11d of the exterior cover 11. Further, female end screws 13a to 16a are provided at the respective ends of the female stick screws 13 to 16. Cover male screws are screwed into the female end screws 13a to 16a to fix the exterior cover 11. The printed circuit boards 5 are mounted over the base members 4A, 4B by spacers 10. The second embodiment uses the rivets 7 to fix the printed circuit boards 5. However, the printed circuit boards 5 can be fixed by an adhesive or in other manners.

Then, as shown in the top view of FIG. 2C, the exterior cover 11 is placed on the housing 1 to cover it. The exterior cover 11 is configured to include the through holes 11a to 11d through which the four cover male screws are inserted. The female stick screws 13 to 16 are disposed in alignment with the through holes 11a to 11d. Cover male screws 17, 18 are screwed into the female end screws 13a, 14a of the female screws 13, 14, respectively. Next, the housing 1 without the base member 4A will be described, for example. In the bottom view of FIG. 2C, the cover male screw 17 is screwed into the female end screw 13a, and the cover male screw 18 is screwed into the female end screw 14a. However, without the base member 4A, the female stick screws 15, 16 for the through holes 11c, 11d of the exterior cover 11 are absent so that the two other cover male screws cannot be screwed into the female end screws 15a, 16a. Accordingly, the two other cover male screws are absent in the through holes 11c, 11d. Thus, a removal of the base member is recognizable from exterior of the electric device.

Figure 3A:
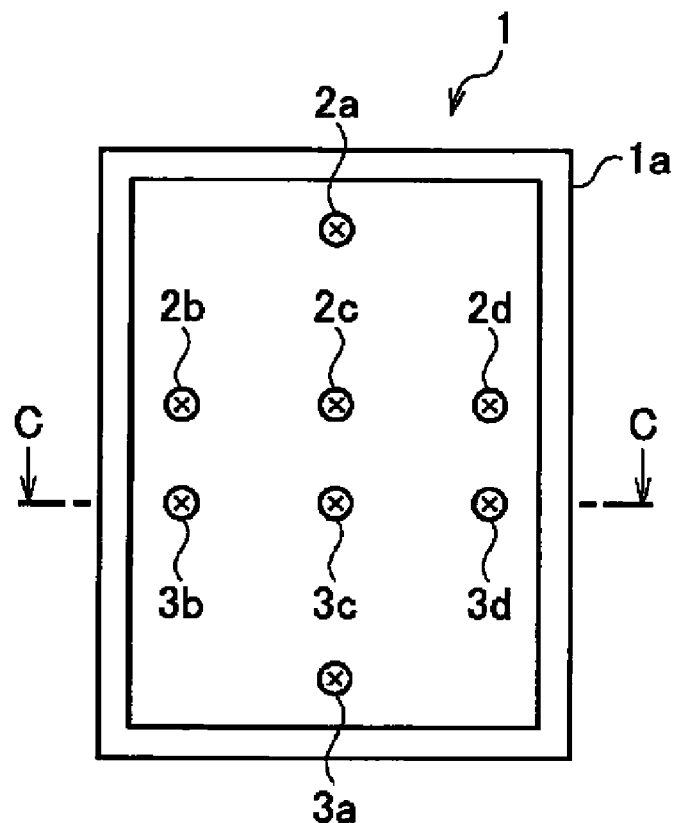
FIGS. 3A to 3C show an assembly of each component of a structure according to a third embodiment.
Figure 3A:
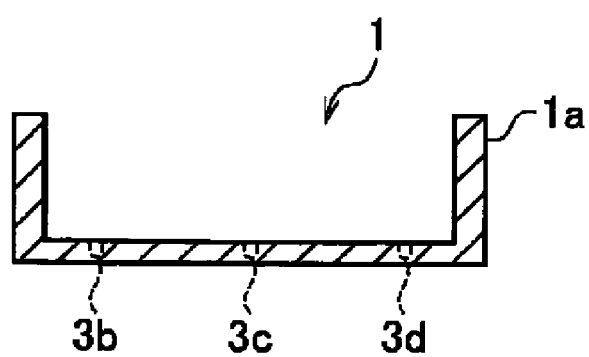
Figure 3B:
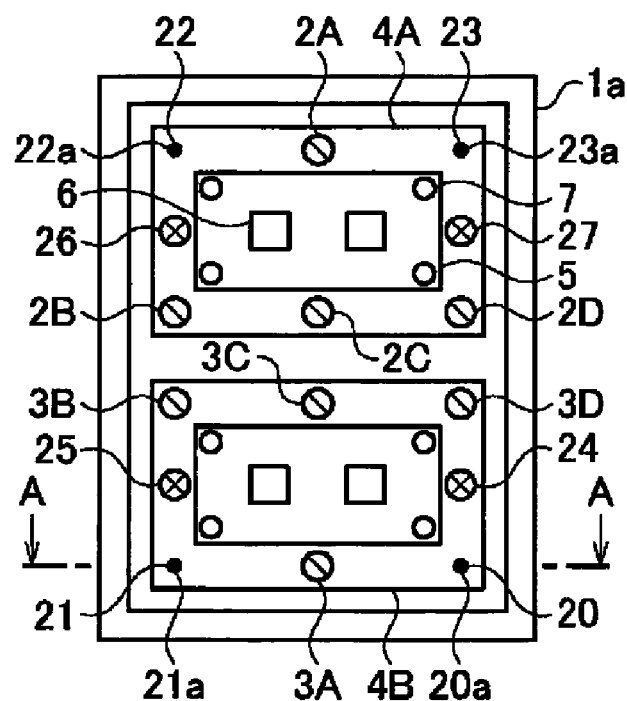
Figure 3B:
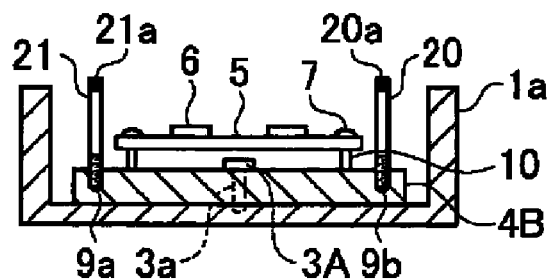
Figure 3C:
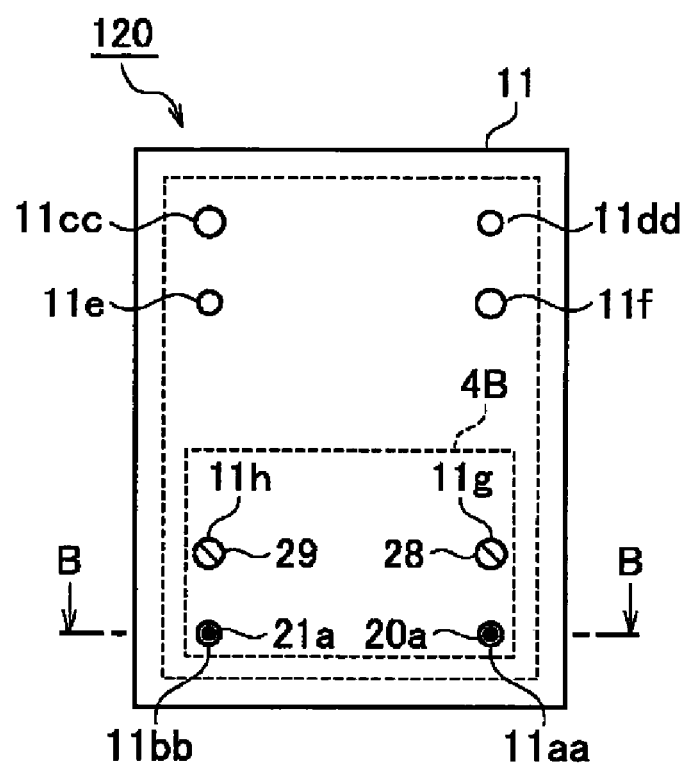
Figure 3C:
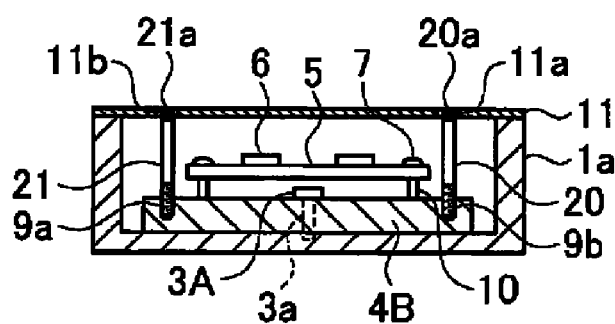

FIGS. 3A to 3C show an assembly of each component of a structure 120 according to a third embodiment. A top view of FIG. 3A is a plain view of a housing and a bottom view thereof is a cross section of the housing along a C-C line. A top view of FIG. 3B is a plain view of the housing to which a base member is attached and a bottom view thereof is a cross section of the housing along an A-A line. A top view of FIG. 3C is a plain view of the housing to which an exterior cover is attached after the base member is detached and a bottom view thereof is a cross section of the housing along a B-B line. The same components as those in FIGS. 1A to 1C will be given the same numeric codes.

The structure 120 in FIG. 3A to FIG. 3C is different from that in FIGS. 1A to 1C in including openings 11aa to 11dd in the exterior cover 11 in addition to through holes 11e to 11h and stick members (second stick member) 20 to 23 which stand on the base member 4A, 4B and whose ends protrude through the openings 11aa to 11dd. As in the top view of FIG. 3B, printed circuit boards 5 each with an electronic component 6 mounted thereon are fixed to base members 4A, 4B by rivets 7. In order to fix the base member 4A to a housing 1, the stick members 22, 23 and cover female screws 26, 27 are disposed in alignment with the openings 11cc, 11dd and the through holes 11e, 11f of the exterior cover 11, respectively. Then, to fasten the base member 4A, a base male screw 2A is screwed into a base female screw 2a, a base male screw 2B is screwed into a base female screw 2b, a base male screw 2C is screwed into a base female screw 2c, and a base male screw 2D is screwed into a base female screw 2d. Similarly, in order to fix the base member 4B to the housing 1, the stick members 20, 21 and cover female screws 24, 25 are disposed in alignment with the openings 11aa, 11bb and the through holes 11g, 11h of the exterior cover 11, respectively. Then, to fasten the base member 4B, a base male screw 3A is screwed into a base female screw 3a, a base male screw 3B is screwed into a base female screw 3b, a base male screw 3C is screwed into a base female screw 3c, and a base male screw 3D is screwed into a base female screw 3d. Thereby, the base members 4A, 4B are each fixed to the housing 1 with the four base male screws, and the stick members 20 to 23 are placed in the four corners of the frame 1a. In the third embodiment, to fix the exterior cover 11, the stick members 20 to 23 stand in the cover female screws 8a, 8b, 9a, 9b to reach the openings 11aa to 11dd of the exterior cover 11, and four cover male screws (28, 29 in FIG. 3C) are screwed into the cover female screws 24 to 27. The printed circuit boards 5 are mounted over the base members 4A, 4B by spacers 10. The third embodiment uses the rivets 7 to fix the printed circuit boards 5. However, the printed circuit boards 5 can be fixed by an adhesive or in other manners.

Then, as shown in the top view of FIG. 3C, the exterior cover 11 is placed on the housing 1 to cover it. The exterior cover 11 is configured to include the openings 11aa to 11dd through which the stick members are inserted. The stick members are disposed in alignment with the openings 11aa to 11dd. Next, the housing 1 without the base member 4A will be described. In the bottom view of FIG. 3C, the stick member 20 is screwed into the cover female screw 9b, and the stick member 21 is screwed into the cover female screw 9a. However, without the base member 4A, the stick members 22, 23 corresponding to the openings 11cc, 11dd and the cover female screws 26, 27 corresponding to the through holes 11e, 11f of the exterior cover 11 are absent so that the ends of the stick members cannot protrude from the openings 11cc, 11dd of the exterior cover 11 and the two corresponding cover male screws cannot be screwed. Accordingly, the cover male screws are absent in the openings 11cc, 11dd. Thus, a removal of the base member is instantly recognizable from exterior of the electric device. In addition, the ends (20a, 21a in FIG. 3C) of the stick members can be formed in different colors from the exterior cover 11. This can facilitate visual checking.

Figure 4:
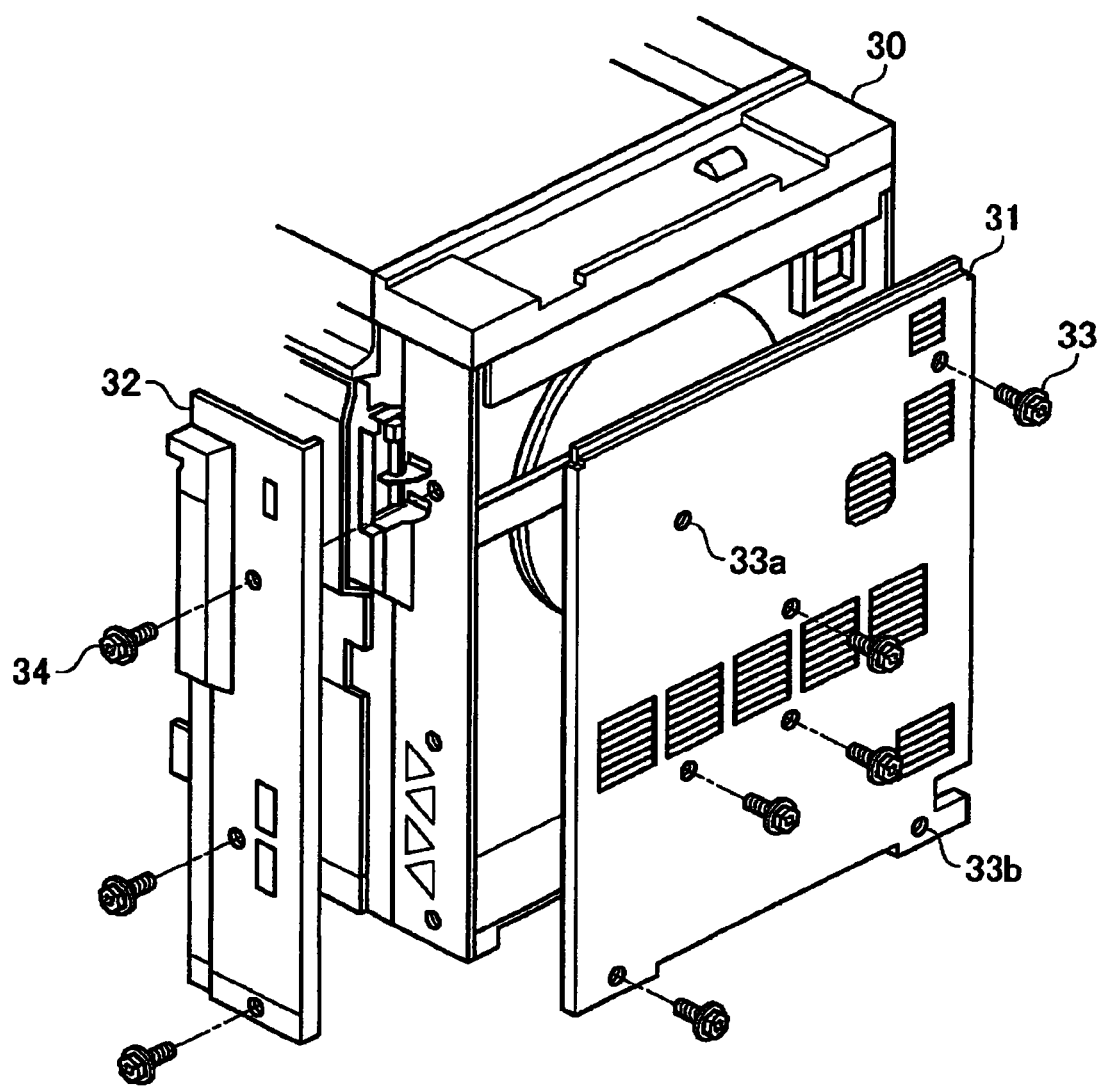
FIG. 4 shows a device (copier, printer, facsimile machine, or the like, for example) comprising the structure according to any of the first to third embodiments.

FIG. 4 shows an example of a collected electric device (such as a copier, a printer, or a facsimile machine) comprising the structure according to any one of the first to third embodiments. A back cover 31 and a side cover 32 are attached to a housing 30 with cover male screws 33, 34, respectively. In a case where the back cover 31 is opened on purpose to detach a printed circuit board 5 or the like from inside and then the back cover 31 is put into the original place, cover female screws corresponding to cover male screws passing through through holes 33a, 33b are absent so that the corresponding male screws cannot be fastened, for example. Accordingly, without turning on the electric device, it is possible to visually determine from outside that the collected device is not suitable for reproduction.

As described above, the structure according to the prevent invention is configured not to be able to detach a main component from a base member. In order to remove the main component, the base member needs to be detached concurrently. Without the base member, it is not possible to fasten the exterior cover with male screws so that a removal of the main component can be easily determined from outside of the structure.

Although the present invention has been described in terms of exemplary embodiments, it is not limited thereto. It should be appreciated that variations may be made in the embodiments described by persons skilled in the art without departing from the scope of the present invention as defined by the following claims.

The invention claimed is:

1. A missing part checking structure which is mounted in an electric device having an accommodation space for a main component and an exterior cover to close the accommodation space and which allows presence or absence of the main component to be checked from exterior of the electric device, the structure comprising:
   a fastening member;
   a base member which is detachably fixed in the accommodation space, on which the main component is inseparably fixed, and which comprises a receive portion receiving the fastening member to detachably fasten the exterior cover with the fastening member, wherein
   when the base member together with the main component is removed from the accommodation space, the exterior cover is configured to be unfixable to the electric device.

2. A missing part checking structure according to claim 1, wherein
   the fastening member is a male screw and the receive portion is a female screw into which the male screw is screwed.

3. A missing part checking structure according to claim 1, further comprising a first stick member standing on the base member, wherein
   the receive portion is provided at one end of the first stick member.

4. A missing part checking structure according to claim 1, further comprising a second stick member standing on the base member, wherein
   the exterior cover comprises a hole through which the fastening member passes to be fitted into the receive portion, and an opening from which an end portion of the second stick member protrudes.

5. A missing part checking structure according to claim 4, wherein the end portion of the second stick member is different in color from the exterior cover.

* * * * *